(12) United States Patent
Yoneda et al.

(10) Patent No.: US 9,559,327 B2
(45) Date of Patent: Jan. 31, 2017

(54) ORGANIC LIGHT EMITTING DEVICE AND METHOD FOR MANUFACTURING SAME

(71) Applicant: JOLED INC., Tokyo (JP)

(72) Inventors: Kazuhiro Yoneda, Tokyo (JP); Minhhiep Hoang, Kanagawa (JP); Noriyuki Matsusue, Tokyo (JP); Jun Hashimoto, Tokyo (JP); Masaki Nishimura, Tokyo (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 14/917,686

(22) PCT Filed: Sep. 11, 2014

(86) PCT No.: PCT/JP2014/004680
§ 371 (c)(1),
(2) Date: Mar. 9, 2016

(87) PCT Pub. No.: WO2015/037237
PCT Pub. Date: Mar. 19, 2015

(65) Prior Publication Data
US 2016/0226014 A1   Aug. 4, 2016

(30) Foreign Application Priority Data
Sep. 13, 2013  (JP) .................................. 2013-190189

(51) Int. Cl.
*H01L 51/00* (2006.01)
*H01L 51/52* (2006.01)
(Continued)

(52) U.S. Cl.
CPC ....... *H01L 51/5212* (2013.01); *H01L 27/3211* (2013.01); *H01L 27/3276* (2013.01);
(Continued)

(58) Field of Classification Search
CPC ............. H01L 51/5212; H01L 51/5253; H01L 51/5072; H01L 51/5088; H01L 51/5092; H01L 51/5234; H01L 51/56; H01L 27/3276; H01L 27/3211
See application file for complete search history.

(56) References Cited

U.S. PATENT DOCUMENTS 6,483,236 B1   11/2002  Hung
7,317,280 B2 *  1/2008  Qiu .................... H01L 51/5256
                                                    313/503
(Continued)

FOREIGN PATENT DOCUMENTS

JP   2002-015873   1/2002
JP   2004-111369   4/2004
(Continued)

OTHER PUBLICATIONS

U.S. Appl. No. 14/902,881 to Minh Hiep Hoang et al., filed Jan. 5, 2016.
(Continued)

*Primary Examiner* — Nicholas Tobergte
(74) *Attorney, Agent, or Firm* — Greenblum & Bernstein, P.L.C.

(57) ABSTRACT

An organic light-emitting device includes: an anode; a wiring that is disposed side-by-side with and spaced from the anode; a light-emitting layer that is disposed above the anode, and includes an organic light-emitting material; an intermediate layer that is disposed above the light-emitting layer and the wiring; an organic functional layer that is disposed above the intermediate layer, and has an electron injection property or an electron transport property; a cathode that is disposed above the organic functional layer. The intermediate layer includes: a fluoride of a first metal, the first metal being an alkali metal or an alkaline-earth metal;
(Continued)

and a second metal that has a property of cleaving a bond between the first metal and fluorine in the fluoride.

13 Claims, 9 Drawing Sheets

(51) Int. Cl.
H01L 27/32 (2006.01)
H01L 51/50 (2006.01)
H01L 51/56 (2006.01)

(52) U.S. Cl.
CPC ...... H01L 51/5072 (2013.01); H01L 51/5088 (2013.01); H01L 51/5092 (2013.01); H01L 51/5234 (2013.01); H01L 51/5253 (2013.01); H01L 51/56 (2013.01); H01L 2251/301 (2013.01); H01L 2251/303 (2013.01); H01L 2251/308 (2013.01); H01L 2251/558 (2013.01)

(56) References Cited

U.S. PATENT DOCUMENTS

| | | | |
|---|---|---|---|
| 8,796,674 B2 * | 8/2014 | Furukawa | H01L 51/0072 257/40 |
| 8,809,091 B2 * | 8/2014 | Takahashi | H01L 51/56 257/E51.005 |
| 2004/0056591 A1 | 3/2004 | Koo et al. | |
| 2004/0160170 A1 | 8/2004 | Sato et al. | |
| 2005/0012454 A1 | 1/2005 | Yamazaki et al. | |
| 2005/0098207 A1 | 5/2005 | Matsumoto et al. | |
| 2005/0194890 A1 | 9/2005 | Koo et al. | |
| 2006/0019573 A1 | 1/2006 | Koo et al. | |
| 2007/0029929 A1 | 2/2007 | Nakamura et al. | |
| 2007/0190887 A1 | 8/2007 | Sato et al. | |
| 2007/0205718 A1 | 9/2007 | Yamazaki et al. | |
| 2007/0210705 A1 | 9/2007 | Yokoi et al. | |
| 2009/0286445 A1 | 11/2009 | Yamazaki et al. | |
| 2010/0084646 A1 | 4/2010 | Matsusue et al. | |
| 2010/0302221 A1 | 12/2010 | Okumoto | |
| 2011/0233572 A1 | 9/2011 | Nakatani et al. | |
| 2012/0074397 A1 | 3/2012 | Okumoto | |
| 2014/0312337 A1 | 10/2014 | Isobe | |

FOREIGN PATENT DOCUMENTS

| | | |
|---|---|---|
| JP | 2004-207217 | 7/2004 |
| JP | 2005-038833 | 2/2005 |
| JP | 2005-166637 | 6/2005 |
| JP | 2006-200285 | 8/2006 |
| JP | 2007-073499 | 3/2007 |
| JP | 2007-317378 | 12/2007 |
| JP | 4621818 | 1/2011 |
| JP | 2011-040167 | 2/2011 |
| JP | 2011-142063 | 7/2011 |
| JP | 2011-243511 | 12/2011 |
| JP | 2012-018938 | 1/2012 |
| JP | 4852660 | 1/2012 |
| JP | 2012-038624 | 2/2012 |
| JP | 2012-094299 | 5/2012 |
| JP | 2012-216309 | 11/2012 |
| WO | 2009/110186 | 9/2009 |
| WO | 2013/076948 | 5/2013 |

OTHER PUBLICATIONS

U.S. Appl. No. 14/962,240 to Jun Hashimoto et al., filed Dec. 8, 2015.

International Search Report (ISR) from International Searching Authority (Japan Patent Office) in International Pat. Appl. No. PCT/JP2014/004680, dated Oct. 7, 2014.

* cited by examiner

FIG. 7

| | | Sample 1 | Sample 2 | Sample 3 | Sample 4 | Sample 5 | Sample 6 |
|---|---|---|---|---|---|---|---|
| Intermediate layer | Type of metal | — | Al | Al | Al | Al | Al |
| | Thickness of metal [nm] | — | 0.5 | 0.5 | 0.5 | 0.5 | 0.5 |
| Organic functional layer | Thickness of NaF [nm] | 4.0 | 4.0 | 4.0 | 1.0 | 1.0 | 0.5 |
| | Concentration of Ba [wt%] | 20 | 20 | 5 | 20 | 5 | 5 |
| | Thickness [nm] | 35 | 35 | 35 | 35 | 35 | 35 |

| | | Sample 7 | Sample 8 | Sample 9 | Sample 10 | Sample 11 | Sample 12 |
|---|---|---|---|---|---|---|---|
| Intermediate layer | Type of metal | Ba | Ba | Ba | Ba | Ba | Ba |
| | Thickness of metal [nm] | 0.5 | 1.0 | 0.5 | 1.0 | 0.5 | 1.0 |
| Organic functional layer | Thickness of NaF [nm] | 4.0 | 4.0 | 1.0 | 1.0 | 0.5 | 0.5 |
| | Concentration of Ba [wt%] | 20 | 20 | 20 | 20 | 5 | 5 |
| | Thickness [nm] | 35 | 35 | 35 | 35 | 35 | 35 |

ORGANIC LIGHT EMITTING DEVICE AND METHOD FOR MANUFACTURING SAME

TECHNICAL FIELD

The present disclosure relates to an organic light-emitting device including light-emitting layers that include an organic light-emitting material and are each interposed between a corresponding one of anodes and a cathode, and a method for manufacturing the same.

BACKGROUND ART

In recent years, researches have been advanced on organic light-emitting devices including light-emitting layers that include an organic light-emitting material. An organic light-emitting device for example includes a thin-film transistor (TFT) substrate, anodes, light-emitting layers, and a cathode. Also, an organic EL element includes hole injection layers, hole transport layers, an electron injection layer, an electron transport layer, a sealing layer, and so on as necessary. Examples of the organic light-emitting device include an organic EL display panel having a plurality of pixels.

By the way, an organic EL display panel of an active matrix driving type generally includes an anode as an electrode that is formed independently for each pixel and a cathode as an electrode that is formed for the entire pixels. Voltage is applied to the cathode from a peripheral part of the cathode. Accordingly, the size increase of the organic EL display panel causes voltage drop due to the increase of an electrical resistance of the cathode itself. Variation might occur in voltage to be applied between the anode for each pixel and the cathode because of the difference in distance from the peripheral part of the cathode to each pixel. Such a variation in voltage to be applied between the anode for each pixel and the cathode results in luminance unevenness in the organic EL display panel. To address this problem, Patent Literature 1 discloses a technology of preventing variation in voltage to be applied between an anode for each pixel and a cathode by electrically connecting wirings and the cathode that are disposed on a substrate. Such electric connection is often established by direct contact of the wirings with the cathode.

On the other hand, a wet process is sometimes used in a panel manufacturing process. There is for example a case where an interlayer insulating layer to be formed on a TFT circuit, a barrier rib layer constituting subpixels of RGB luminous colors, and so on are formed by application of a positive photosensitive material. There is also a case where a hole injection layer, a hole transport layer, an electron injection layer, an electron transport layer, and light-emitting layers, which constitute an organic EL element, are formed by application of an ink containing an organic material. Layers formed by the wet process might contain moisture and oxygen. Also, formation by the wet process sometimes results in a cathode made of a metal, an organic functional layer including a metal, and so on. In this case, if moisture and oxygen intrude into the cathode and the organic functional layer from the light-emitting layers, the cathode and the organic functional layer might degrade due to oxygenation of the metal included therein, for example. To address this problem, Patent Literature 2 discloses a technology of providing, between light-emitting layers and an organic functional layer, an intermediate layer including fluoride of an alkali metal or an alkaline-earth metal.

CITATION LIST

Patent Literature

[Patent Literature 1]
   Japanese Patent Application Publication No. 2004-111369
[Patent Literature 2]
   Japanese Patent Application Publication No. 2007-317378

SUMMARY OF INVENTION

Technical Problem

According to a method for manufacturing an organic EL display panel, layers constituting the organic EL display panel are often formed for the entire pixels for simplification. However, if a layer including fluoride of an alkali metal or an alkaline-earth metal is formed for the entire pixels, an electric resistance increases between each of wirings and part of a cathode facing the wiring. This is because fluoride of an alkali metal or an alkaline-earth metal has a high electrical resistivity. This makes it difficult to prevent variation in voltage to be applied to the cathode between regions of the organic EL display panel.

In view of this problem, the present disclosure aims to provide an organic light-emitting device that prevents intrusion of moisture and oxygen into a cathode and organic functional layers, and reduces an electric resistance between each of wirings and part of the cathode facing the wiring.

Solution to Problem

In order to achieve the above aim, an organic light-emitting device relating to one aspect of the present disclosure comprises: an anode; a wiring that is disposed side-by-side with and spaced from the anode; a light-emitting layer that is disposed above the anode, and includes an organic light-emitting material; an intermediate layer that is disposed above the light-emitting layer and the wiring; an organic functional layer that is disposed above the intermediate layer, and has an electron injection property or an electron transport property; a cathode that is disposed above the organic functional layer, wherein the intermediate layer includes: a fluoride of a first metal, the first metal being an alkali metal or an alkaline-earth metal; and a second metal that has a property of cleaving a bond between the first metal and fluorine in the fluoride.

Advantageous Effects of Invention

According to the organic light-emitting device relating to the above one aspect of the present disclosure, the intermediate layer includes: the fluoride of the first metal; and the second metal that has a property of cleaving the bond between the first metal and fluorine in the fluoride. With this structure, the intermediate layer includes the fluoride of the first metal. This prevents intrusion of moisture and oxygen from the light-emitting layer into the cathode and the organic functional layer. Also, the intermediate layer includes the second metal, and accordingly the bond between the first metal and fluorine in a part of the fluoride is cleaved. This reduces an amount of the fluoride of the first metal having a high electrical resistivity, and thereby reduces electrical resistance between the wiring and part of the cathode corresponding to the wiring.

BRIEF DESCRIPTION OF DRAWINGS

FIG. 3A shows a state in which an interlayer insulating layer is formed on a substrate including a TFT layer, FIG. 3B shows a state in which the anodes and the wirings are formed on the interlayer insulating layer, and FIG. 3C shows a state in which hole injection layers are formed over the interlayer insulating layer and on the anodes and the wirings.

FIG. 4A shows a state in which a barrier rib layer is formed on the hole injection layers, FIG. 4B shows a state in which a hole transport layer and a light-emitting layer are formed within each of openings provided in the barrier rib layer, and FIG. 4C shows a state in which a sodium fluoride layer is formed on the barrier rib layer, the anodes, and the wirings.

FIG. 5A shows a state in which an intermediate layer is formed on the light-emitting layers, the barrier rib layer, and the wirings, FIG. 5B shows a state in which an electron transport layer is formed on the intermediate layer, and FIG. 5C shows a state in which a cathode and a sealing layer are formed on the electron transport layer in order.

FIG. 7 shows composition of Samples 1-12 used for measuring electrical resistance between each of the wirings and the cathode in the organic EL display panel.

DESCRIPTION OF EMBODIMENTS

Figure 1:
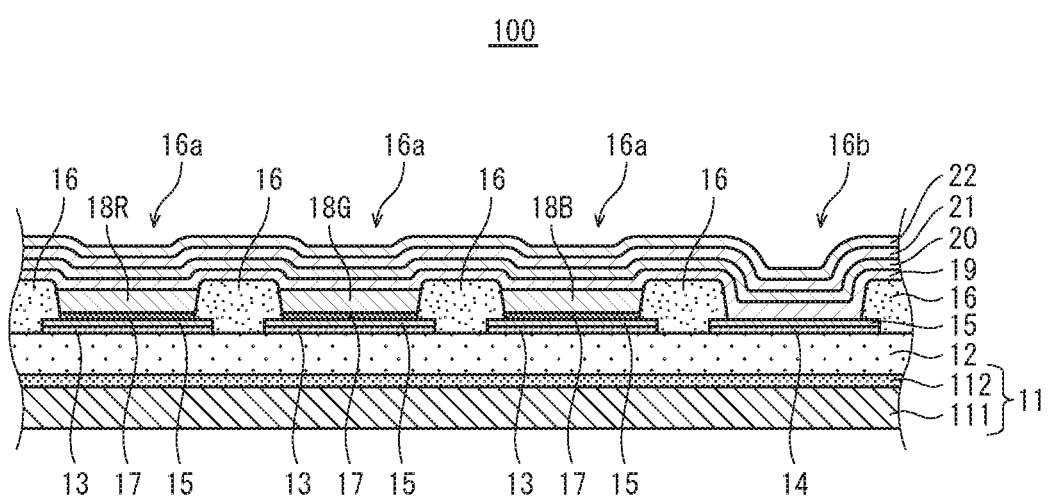
FIG. 1 is a partially cross-sectional view schematically showing the structure of an organic EL display panel that is an example of an organic light-emitting device relating to an embodiment of the present disclosure.

Outline of One Aspect of the Present Disclosure

An organic light-emitting device relating to one aspect of the present disclosure comprises: an anode; a wiring that is disposed side-by-side with and spaced from the anode; a light-emitting layer that is disposed above the anode, and includes an organic light-emitting material; an intermediate layer that is disposed above the light-emitting layer and the wiring; an organic functional layer that is disposed above the intermediate layer, and has an electron injection property or an electron transport property; a cathode that is disposed above the organic functional layer, wherein the intermediate layer includes: a fluoride of a first metal, the first metal being an alkali metal or an alkaline-earth metal; and a second metal that has a property of cleaving a bond between the first metal and fluorine in the fluoride.

Also, in the organic light-emitting device, the fluoride may be sodium fluoride (NaF) or lithium fluoride (LiF).

Also, in the organic light-emitting device, the second metal may be barium (Ba).

Also, in the organic light-emitting device, the second metal may have an electron injection property or an electron transport property, and the organic functional layer may include the same metal as the second metal.

Also, in the organic light-emitting device, the anode and the wiring may be made of the same material.

Also, in the organic light-emitting device, the anode may be made of indium tin oxide (ITO) or indium zinc oxide (IZO).

Also, in the organic light-emitting device, the cathode may be made of a transparent conductive material.

Also, in the organic light-emitting device, the transparent conductive material may be ITO.

The organic light-emitting device may further comprise a hole injection layer that is disposed on each of the anode and the wiring, and is made of tungsten oxide ($WO_x$) or molybdenum oxide ($MoO_x$).

Also, in the organic light-emitting device, the organic functional layer may have a thickness of 25 nm to 45 nm inclusive.

Also, in the organic light-emitting device, the organic functional layer may have a thickness of 30 nm to 40 nm inclusive.

A manufacturing method of an organic light-emitting device relating to another aspect of the present disclosure comprises: forming an anode and a wiring so as to be disposed side-by-side with and spaced from each other; forming, above the anode, a light-emitting layer that includes an organic light-emitting material; forming, above the light-emitting layer and the wiring, an intermediate layer; forming, above the intermediate layer, an organic functional layer that has an electron injection property or an electron transport property; forming, above the organic functional layer, a cathode, wherein the intermediate layer includes: a fluoride of a first metal, the first metal being an alkali metal or an alkaline-earth metal; and a second metal that has a property of cleaving a bond between the first metal and fluorine in the fluoride.

Also, in the manufacturing method of the organic light-emitting device, the forming the intermediate layer may include depositing the fluoride above the light-emitting layer and the wiring, and depositing the second metal above the fluoride.

The following explains the structure and effects of the present disclosure with specific examples.

Note that an embodiment in the following explanation is just an example for simply explaining the structure and effects relating to one aspect of the present disclosure. The present disclosure is not limited by the embodiment except for essential part of the present disclosure. Note that a numerical range stated as "of . . . to . . . " is intended to mean that the upper and lower limits are both inclusive.

Embodiment

1. Structure of Organic EL Display Panel

Figure 2:
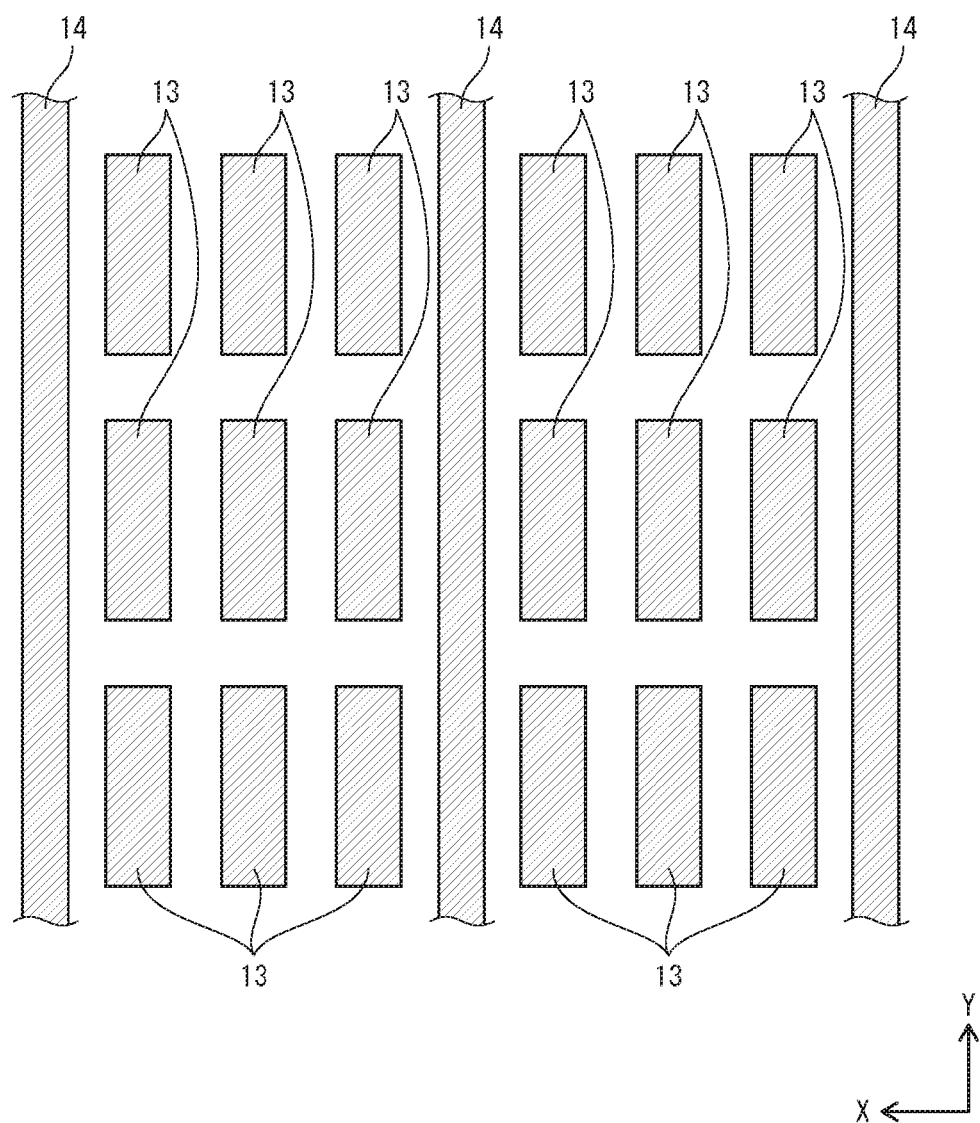
FIG. 2 is a top view showing the arrangement of anodes and wirings in the organic EL display panel shown in FIG. 1.

The following explains an organic EL display panel as an example of an organic light-emitting device relating to the embodiment of the present disclosure, with reference to FIGS. 1 and 2.

FIG. 1 is a partially enlarged cross-sectional view showing an organic EL display panel 100. In the present embodiment, one pixel is composed of respective three subpixels corresponding to red (R), green (G), and blue (B) colors. The organic EL display panel 100 is of a so-called top emission type, and has a display surface on the upper side in the figure.

The organic EL display panel 100 includes a substrate 11, an interlayer insulating layer 12, anodes 13, wirings 14, hole injection layers 15, a barrier rib layer 16, hole transport layers 17, light-emitting layers 18R, 18G, and 18B, an intermediate layer 19, an organic functional layer 20, a cathode 21, and a sealing layer 22. The substrate 11, the interlayer insulating layer 12, the hole injection layers 15, the intermediate layer 19, the organic functional layer 20, the cathode 21, and the sealing layer 22 are formed for the entire pixels included in the organic EL display panel 100. The following explains the structure of the compositional elements included in the organic EL display panel 100.

<Substrate>

The substrate 11 includes a base material 111 and a TFT layer 112. The base material 111 is made of an insulating material such as polyimide resin, acrylic resin, styrene resin, polycarbonate resin, epoxy resin, polyethersulfone, polyethylene, polyester, and silicone resin. Alternatively, the base material 111 may be a glass substrate. The TFT layer 112 includes drive circuits (not shown) that are formed therein for each subpixel.

<Interlayer Insulating Layer>

The interlayer insulating layer 12 is formed on the substrate 11. The interlayer insulating layer 12 is disposed in order to flatten unevenness on an upper surface of the TFT layer 112. The interlayer insulating layer 12 is made for example of a positive photosensitive material such as acrylic resin, polyimide resin, siloxane resin, and phenol resin.

<Anodes>

The anode 13 is formed on the interlayer insulating layer 12 for each subpixel. The anodes 13 have a multilayer structure including a light-reflective conductive material and a transparent conductive material. The light-reflective conductive material is silver (Ag), aluminum (Al), alloy of aluminum, molybdenum (Mo), alloy of silver, palladium, and copper (APC), alloy of silver, rubidium, and gold (ARA), alloy of molybdenum and chromium (MoCr), alloy of molybdenum and tungsten (MoW), alloy of nickel and chromium (NiCr), or the like. The transparent conductive material is indium tin oxide (ITO), indium zinc oxide (IZO), zinc oxide (ZnO), or the like. The anodes 13 may alternatively have a single layer structure of the light-reflective conductive material.

Although not shown in this cross-sectional view, the interlayer insulating layer 12 has a contact hole formed therein for each subpixel. Also, the contact hole has a TFT connection wiring embedded therein. The anodes 13 are electrically connected with the drive circuits formed in the TFT layer 112 via the TFT connection wirings, which are embedded in the contact holes of the interlayer insulating layer 12.

<Wirings>

The wirings 14 are disposed on the interlayer insulating layer 12 side-by-side with and spaced from the anodes 13. The wirings 14 have a multilayer structure including a light-reflective conductive material and a transparent conductive material. The light-reflective conductive material is silver, aluminum, alloy of aluminum, or molybdenum. The transparent conductive material is ITO, IZO, ZnO, or the like. The anodes 13 and the wirings 14 are made of the same material, and accordingly are easily formed in a common process. Alternatively, the anodes 13 and the wirings 14 may be made of different materials. Specifically, the wirings 14 may have a single layer structure of a high-conductive material such as silver and aluminum.

The following explains the arrangement of the anodes 13 and the wirings 14. As shown in FIG. 2, the anodes 13 are each rectangular, and the wirings 14 are each linear. The anodes 13 are arranged in the vertical direction in the figure. Each two adjacent wirings 14 are arranged so as to interpose three rows of the anodes 13 therebetween. The arrangement of the wirings 14 in this manner allows application of voltage between each of the wirings 14 and part of the cathode 21 corresponding to the wiring 14 shown in FIG. 1.

<Hole Injection Layers>

The hole injection layers 15 have a function of promoting injection of holes from the anodes 13 to the light emitting layers 18. For this reason, the hole injection layer 15 may not need to be formed on each of the wirings 14. The hole injection layers 15 are made for example of metal oxide. The hole injection layers 15 are formed for example by a sputtering method. The metal oxide, which is the material for the hole injection layers 15, is tungsten oxide ($WO_x$), molybdenum oxide ($MoO_x$), silver (Ag), chromium (Cr), vanadium (V), nickel (Ni), iridium (Ir), or the like. Alternatively, the hole injection layers 15 may be made of polyethylenedioxythiophene (PEDOT), polyaniline, or the like. In this case, the hole injection layers 15 are formed by applying and drying an ink. A barrier rib layer is necessary for a process of ink application. Accordingly, the hole injection layers 15 are formed by applying an ink after formation of the barrier rib layer 16 and before formation of the hole transport layers 17. Further alternatively, the hole injection layers 15 may be made of a combination of a layer formed by the sputtering method or the like and a layer formed by ink application.

<Barrier Rib Layer>

The barrier rib layer 16 has openings 16a and 16b provided therein. The barrier rib layer 16 covers partial regions of respective upper surfaces of the anodes 13 and the wirings 14, and exposes remaining regions of the respective upper surfaces of the anodes 13 and the wirings 14. The openings 16a are provided above the anodes 13 in one-to-one correspondence, and accordingly the openings 16a one-to-one correspond to the subpixels.

In the case where the light-emitting layers 18 are formed by a wet process, the barrier rib layer 16 prevents overflow of an applied ink. In the case where the light-emitting layers 18 are formed by a vapor deposition method, on the other hand, the barrier rib layer 16 functions as a structure for placing a vapor deposition mask. The barrier rib layer 16 is made for example of a positive photosensitive material. Specifically, the barrier rib layer 16 is made for example of phenol resin, acrylic resin, polyimide resin, siloxane resin, or the like.

<Hole Transport Layers>

The hole transport layers 17 have a function of transporting holes, which are injected from the hole injection layers 15, to the light-emitting layers 18. For this reason, the hole injection layer 17 may not need to be formed on each of the wirings 14. The hole transport layers 17 are formed by applying and drying a solution of an organic material. The organic material, which is the material for the hole transport layers 17, should be high-molecular compound such as polyfluorene, polyfluorene derivative, polyallylamine, and polyallylamine derivative. Alternatively, the hole transport layers 17 may be made of triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound, styrylamine compound, butadiene compound, polystyrene derivative, hydrazone derivative, triphenylmethane derivative, or tetraphenylbenzene derivative. In particular, porphyrin compound, aromatic tertiary amine compound, styrylamine compound, or the like is preferable. In this case, the hole transport layers 17 are formed by a vacuum deposition method.

<Light-Emitting Layers>

The light-emitting layers 18R, 18G, and 18B each have a function of emitting light of a corresponding one of the R, G, and B colors owing to recombination of holes and electrons. The light-emitting layers 18R, 18G, and 18B are hereinafter referred to collectively as the light-emitting layers 18 when distinction therebetween is unnecessary. The light-emitting layers 18 are each formed within the opening 16a, which is provided in the barrier rib layer 16, above a corresponding one of the anodes 13. The light-emitting layers 18 include an organic light-emitting material. The organic light-emitting material is for example a fluorescent substance such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, and metal complex of 8-hydroxyquinoline compound, metal complex of 2-bipyridine compound, complex of a Schiff base and group III metal, oxine metal complex, and rare earth complex. The organic light-emitting material also may be a known phosphor substance such as metal complex emitting phosphor light such as tris (2-phenylpyridine) iridium. Alternatively, the light-emitting layers 18 may be made of high-molecular compound such as polyfluorene, polyfluorene derivative, polyphenylene, polyphenylene derivative, polyallylamine, and polyallylamine derivative, or a mixture of low-molecular compound and the high-molecular compound. In this case, the light-emitting layers 18 are formed by applying and drying a solution of an organic material.

<Intermediate Layer>

The intermediate layer 19 is formed in common above the light-emitting layers 18, the barrier rib layer 16, and the wirings 14. In other words, the intermediate layer 19 is formed in common for the entire pixels. The intermediate layer 19 includes fluoride of a first metal, and a second metal. The first metal is an alkali metal or an alkaline-earth metal. The fluoride of the first metal has a property of preventing penetration of moisture and oxygen. Accordingly, the intermediate layer 19 prevents moisture and oxygen included in the light-emitting layers 18 from intruding into the organic functional layer 20 and the cathode 21. The fluoride of the first metal is made of sodium fluoride (NaF), lithium fluoride (LiF), cesium fluoride (CsF), or the like. The second metal has a property of cleaving a bond between the first metal and fluorine in the fluoride of the first metal. The second metal is made of barium (Ba), aluminum (Al), or the like.

<Organic Functional Layer>

The organic functional layer 20 is formed in common above the light-emitting layers 18, the barrier rib layer 16, and the wirings 14 via the intermediate layer 19. In other words, the organic functional layer 20 is formed in common for the entire pixels. Also, the organic functional layer 20 is formed between each of the light-emitting layers 18 and the cathode 21 above a corresponding one of the anodes 13, and between the intermediate layer 19 and the cathode 21 above each of the wirings 14. The organic functional layer 20 for example has a function as an electron transport layer that transports electrons, which are injected from the cathode 21, to the light-emitting layers 18. The organic functional layer 20 is made for example of an organic material including metal having an electron transport property. Inclusion of the metal having the electron transport property improves an electron transport property of the organic functional layer 20. The organic material for the organic functional layer 20 is for example oxadiazole derivative (OXD), triazole derivative (TAZ), phenanthroline derivative (BCP, Bphen), or the like. The metal included in the organic functional layer 20 is for example barium, lithium (Li), calcium (Ca), potassium (K), cesium (Cs), sodium, rubidium (Rb), or the like. Note that the organic functional layer 20 may be made only of the organic material having the electron transport property.

<Cathode>

The cathode 21 is formed in common above the light-emitting layers 18, the barrier rib layer 16, and the wirings 14 via the organic functional layer 20. The cathode 21 is formed in common for the entire pixels. The cathode 21 is made for example of a transparent conductive material, and this allows extraction of light, which is emitted by the light-emitting layers 18, from the side of the cathode 21. The transparent conductive material for the cathode 21 is for example ITO, IZO, or the like. Alternatively, the cathode 21 may be made of magnesium-silver (MgAg). In this case, setting the thickness of the cathode 21 to approximately several tens nm allows light to transmit through the cathode 21.

<Sealing Layer>

The sealing layer 22 is formed on the cathode 21. The sealing layer 22 has a function of preventing moisture and oxygen from intruding from the opposite side of the substrate 11 into the organic functional layer 20 and the cathode 21. The sealing layer 22 is made for example of a light-transmissive material such as silicon nitride (SiN) and silicon oxynitride (SiON).

<Others>

Although not shown in FIG. 1, a color filter, an upper substrate, and so on may be adhered onto the sealing layer 22. Adherence of the upper substrate protects the light-emitting layers 18 and the organic functional layer 20 against moisture, air, and so on.

2. Manufacturing Method of Organic EL Display Panel

Next, an example of a manufacturing method of the organic EL display panel 100 is explained, with reference to cross-sectional views in FIGS. 3A to 5C.

Figure 3A:
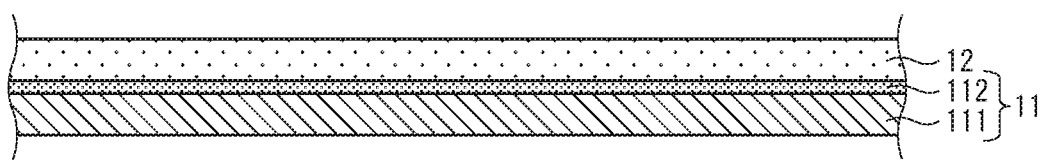
FIGS. 3A-3C are partial cross-sectional views schematically showing part of a manufacturing process of the organic EL display panel shown in FIG. 1, where

As shown in FIG. 3A, the substrate 11, on which the interlayer insulating layer 12 is layered, is formed.

Figure 3B:
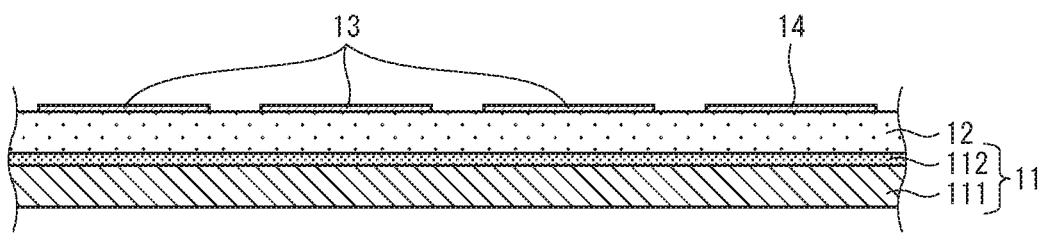

As shown in FIG. 3B, the anodes 13 and the wirings 14 are formed on the interlayer insulating layer 12.

Figure 3C:
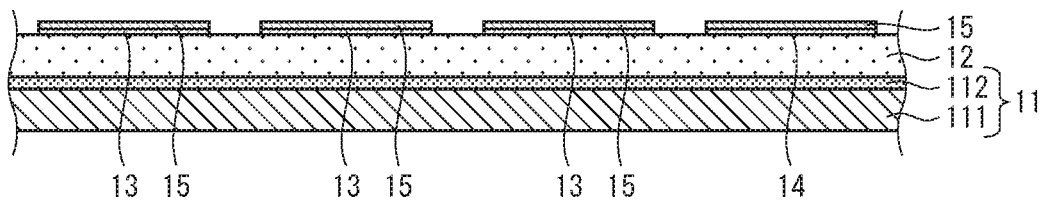

As shown in FIG. 3C, the hole injection layer 15 is formed on each of the anodes 13 and each of the wirings 14. Note that the hole injection layer 15 may not need to be formed on each of the wirings 14. Also, in the case where the hole injection layers 15 are formed by an application process, the hole injection layers 15 are formed after formation of the barrier rib layer 16 and before formation of the hole transport layers 17.

Figure 4A:
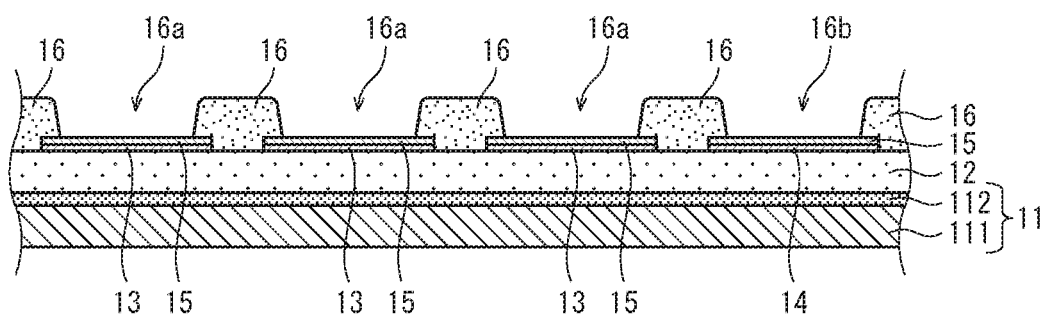
FIGS. 4A-4C are partial cross-sectional views schematically showing part of the manufacturing process of the organic EL display panel shown in FIG. 1, where

As shown in FIG. 4A, the barrier rib layer 16, in which the openings 16a and 16b are provided, is formed.

Figure 4B:
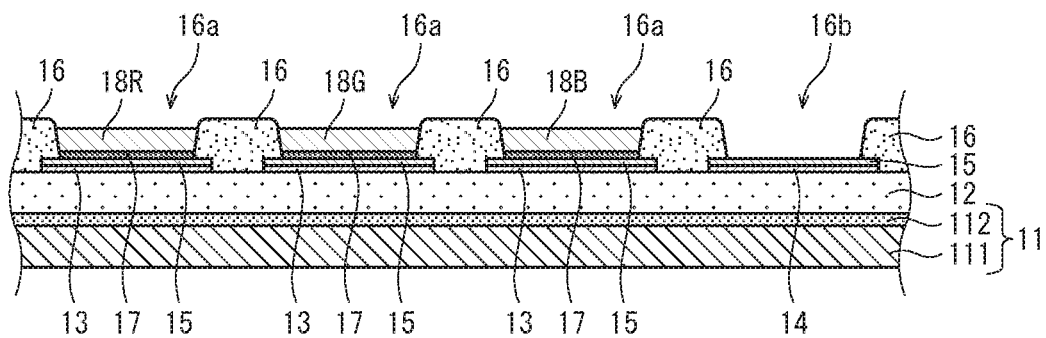

As shown in FIG. 4B, the hole transport layer 17 is formed on each of the anodes 13 and each of the wirings 14, and the light-emitting layer 18 is formed in each of the openings 16a. Note that the hole injection layer 17 may not need to be formed on each of the wirings 14. The hole transport layers 17 and the light-emitting layers 18 are each formed by applying and baking (drying) an ink including an organic material. Note that the hole transport layers 17 and the light-emitting layers 18 may be formed for example by the vacuum deposition method, without limiting to the wet process.

Figure 4C:
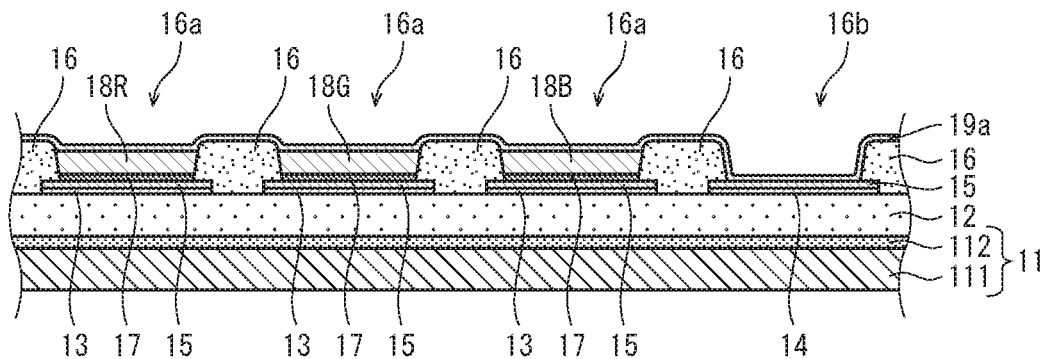

As shown in FIG. 4C, a sodium fluoride layer 19a is deposited in common on the light-emitting layers 18, the barrier rib layer 16, and the wirings 14. Specifically, the sodium fluoride layer 19a is deposited by the vacuum deposition method or the sputtering method.

Figure 5A:
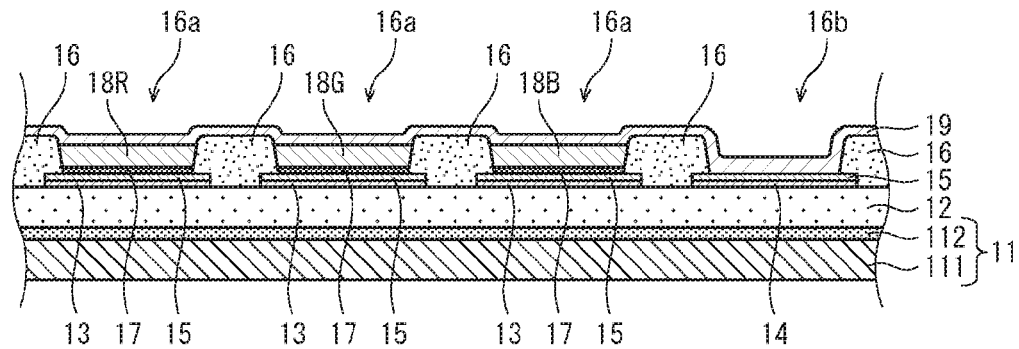
FIGS. 5A-5C are partial cross-sectional views schematically showing part of the manufacturing process of the organic EL display panel shown in FIG. 1, where

Next, as shown in FIG. 5A, the intermediate layer 19 is formed on the light-emitting layers 18, the barrier rib layer 16, and the wirings 14. Formation of the intermediate layer 19 completes by depositing barium on the sodium fluoride layer 19a, which is shown in FIG. 4C. Barium is considered to intrude into the sodium fluoride layer 19a after being deposited on the sodium fluoride layer 19a. As a result, the intermediate layer 19 is formed, which includes sodium fluoride and barium. This is because barium has a property of cleaving a bond between sodium and fluorine in sodium fluoride. Accordingly, barium cleaves the bond between sodium and fluorine in part of the sodium fluoride layer 19a, and sodium fluoride remains in remainder of the sodium fluoride layer 19a. Note that barium is deposited specifically by the vacuum deposition method or the sputtering method.

Figure 5B:
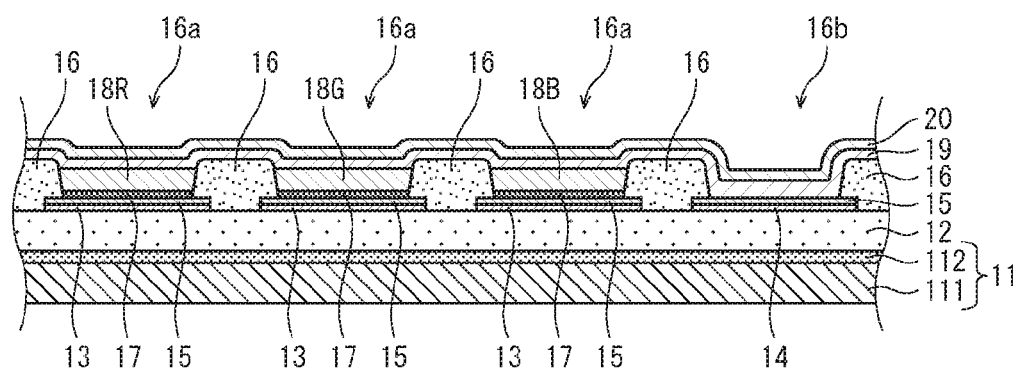

As shown in FIG. 5B, the organic functional layer 20 including barium is formed on the intermediate layer 19. Specifically, the organic functional layer 20, with which barium is doped, is formed by depositing a material for organic functional layer and barium by the vacuum deposition method. The organic functional layer 20 includes barium, which is the same metal as the second metal included in the intermediate layer 19. This reduces the number of types of materials to be prepared, and thus simplifies manufacturing of the organic EL display panel 100.

Figure 5C:
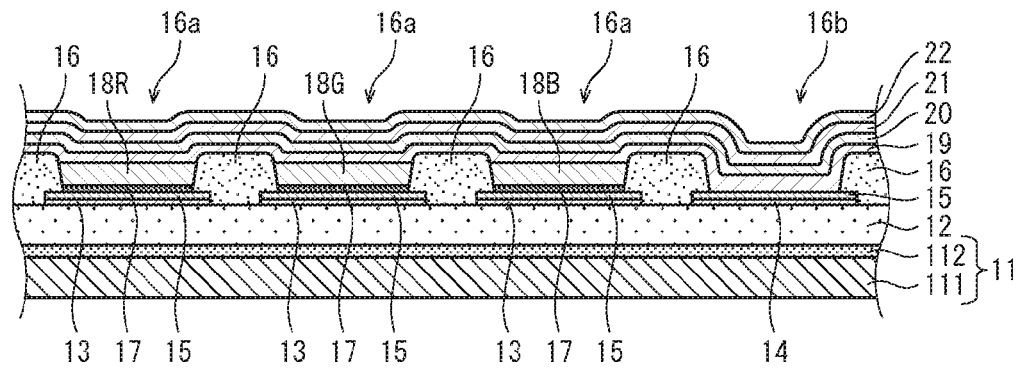

Lastly, as shown in FIG. 5C, the cathode 21 and the sealing layer 22 are formed on and above the organic functional layer 20. Specifically, the cathode 21 is first formed by forming a film from ITO by the vacuum deposition method, the sputtering method, or the like. Further, the sealing layer 22 is formed by forming a film from SiN by the sputtering method, a chemical vapor deposition (CVD) method, or the like.

The organic EL display panel 100 is complete through the above processes. According to organic light-emitting devices of the top emission type such as the organic EL display panel 100, there is a case where the thickness of a cathode is reduced in order to increase the light-extraction efficiency. Such organic light-emitting devices whose cathode has a reduced thickness have a tendency that voltage of the cathode varies in a panel screen. Accordingly, it is effective to reduce electric resistance especially between each of wirings and part of the cathode facing the wiring.

3. Consideration on Intermediate Layer

In the intermediate layer 19 of the organic EL display panel 100, barium cleaves the bond between sodium and fluorine in part of the sodium fluoride layer 19a, and the bond remains in remainder of the sodium fluoride layer 19a. Accordingly, the remainder of the sodium fluoride prevents, above the anodes 13, moisture and oxygen from intruding from the light-emitting layers 18 into the organic functional layers 20 and the cathode 21. Furthermore, the intermediate layer 19 is formed in common for the entire pixels for simplification. Here, sodium fluoride included in the intermediate layer 19 has a high electrical resistivity. With this composition, barium included in the intermediate layer 19 cleaves the bond between sodium and fluorine in a part of the sodium fluoride, and as a result an amount of sodium fluoride included in the intermediate layer 19 lowers. This reduces the electrical resistance between each of the wirings 14 and part of the cathode 21 facing the wiring 14, and thus prevent variation in voltage of the cathode 21 in the panel screen. The following explains experiment and verification performed on this point.

(Analysis on Decomposability of Sodium Fluoride)

Respective samples for Example 1 and Comparative example 1 were created, and secondary ion mass spectrometry (SIMS) analysis was performed on the samples. Example 1 is an element that includes a silicon substrate, an intermediate layer including a sodium fluoride layer having a thickness of 20 nm and a barium layer having a thickness of 2 nm, an organic functional layer having a thickness of 20 nm made only of an organic material, and an aluminum layer having a thickness of 50 nm, which are layered in order. On the other hand, Comparative example 1 is an element that differs from Example 1 in terms of including an intermediate layer including only a sodium fluoride layer having a thickness of 20 nm and an organic functional layer with which barium, which is to be formed on the sodium fluoride layer as a layer, is doped. Thus, Comparative example 1 has a significantly reduced amount of contact between barium and sodium fluoride. Also, the above respective thicknesses of the sodium fluoride layer and the barium layer, which are included in the intermediate layer of Example 1, are based on the assumption that sodium fluoride and barium are each formed as a layer. The same applies to elements used for the following measurement.

Figure 6A:
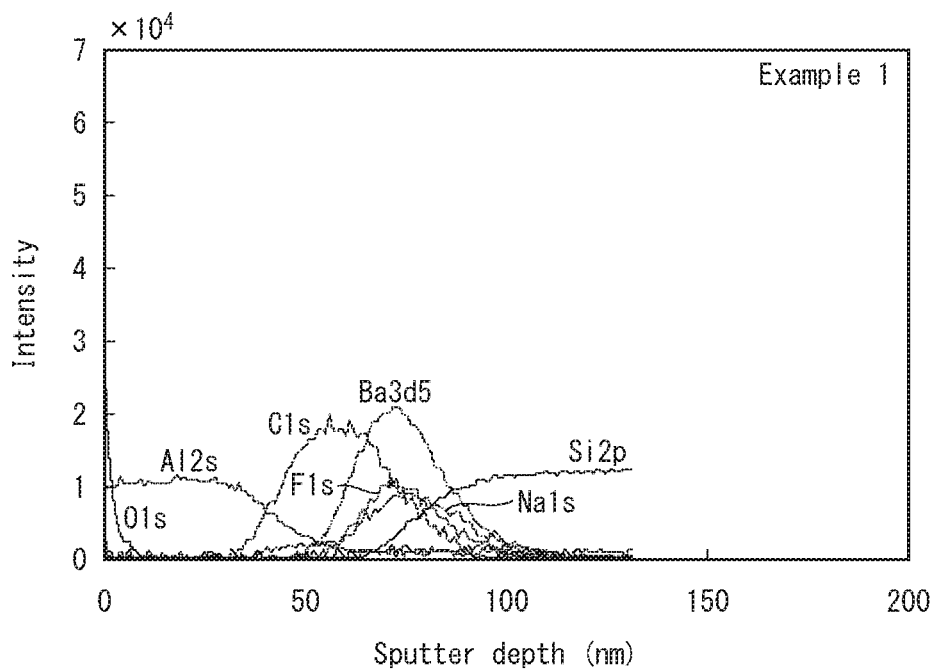
FIGS. 6A and 6B show results of SIMS analysis on the organic EL display panel with respect to Example 1 and Comparative example 1, respectively.
Figure 6B:
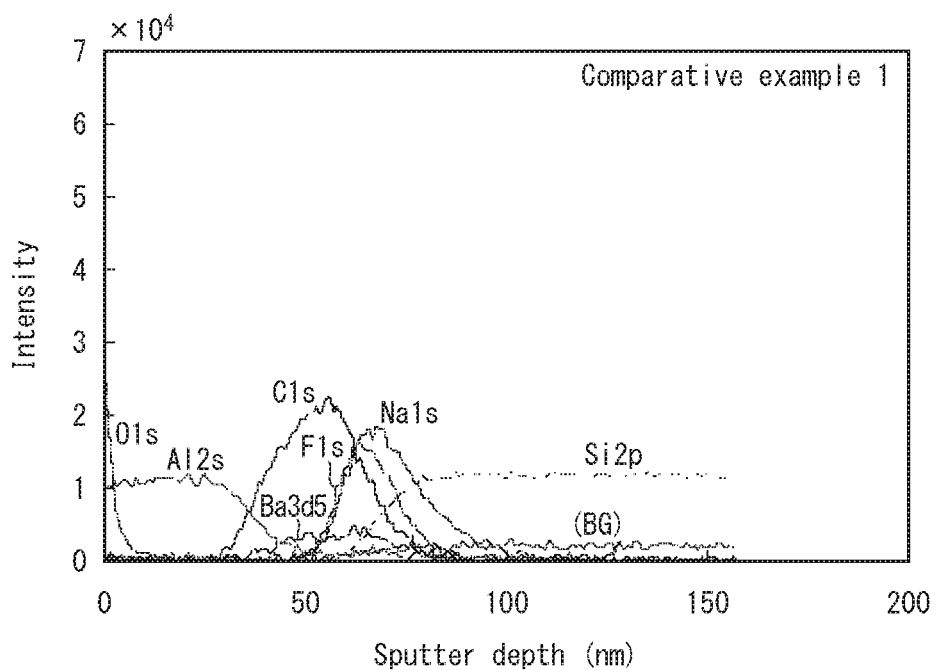

FIGS. 6A and 6B show analysis results of Example 1 and Comparative example 1, respectively. Both in FIGS. 6A and 6B, the horizontal axis represents the sputter depth, and the vertical axis represents the intensity of ions escaped by sputtering.

In Comparative example 1 as shown in FIG. 6B, a peak of the 1s orbital of oxygen was observed at a sputter depth of 0 nm, and the 2s orbital of aluminum was observed at a sputter depth of 0 nm to 40 nm. Also, a peak of the 1s orbital of carbon was observed at a sputter depth of 60 nm, and the 3d5 orbital of barium was observed at a sputter depth of 40 nm to 80 nm. Further, the 1s orbital of fluorine and the 1s orbital of sodium were observed at a sputter depth of 50 nm to 100 nm. Moreover, the 2p orbital of silicon was observed at a sputter depth 80 nm or higher.

As shown in FIG. 6A, Example 1 is substantially the same as Comparative example 1 in respective sputter depths at which the 1s orbital of oxygen, the 2s orbital of aluminum, the 1s orbital of carbon, and the 2p orbital of silicon were observed. However, Example 1 differs from Comparative example 1 in respective sputter depths at which the 3d5 orbital of barium, the 1s orbital of fluorine, and the 1s orbital of sodium were observed. Specifically, while the 3d5 orbital of barium was observed at the sputter depth of 40 nm to 80 nm in Comparative example 1, and 3d5 orbital of barium was observed at a sputter depth of 50 nm to 90 nm in Example 1. Further, since the intensity of barium is low in Comparative example 1, it is found that a contained amount of barium is low and a rate at which barium contacts sodium fluoride is low. Also, while the 1s orbital of fluorine and the 1s orbital of sodium were observed at the sputter depth of 50 nm to 100 nm in Comparative example 1, the 1s orbital of fluorine and the 1s orbital of sodium were observed at a sputter depth of 50 nm to 120 nm in Example 1. The respective intensities of the 1s orbital of fluorine and the 1s orbital of sodium in Example 1 are lower than those in Comparative example 1. This demonstrates that fluorine and sodium in Example 1 diffused in a layering direction of the layers. This diffusion of sodium and fluorine is due to that barium, which is formed as a layer on sodium fluoride, reacts with the sodium fluoride, and cleaves a bond between sodium and fluorine in a part of the sodium fluoride. Also, although the intermediate layer of Example 1 is explained as including the sodium fluoride layer having the thickness of 20 nm and the barium layer having the thickness of 2 nm, it is considered that the intermediate layer actually includes sodium fluoride and barium that are mixed, and does not have a layer structure.

(Lowering Effects of Electrical Resistance Between Each Wiring and Part of Cathode Facing Wiring)

Figure 8:
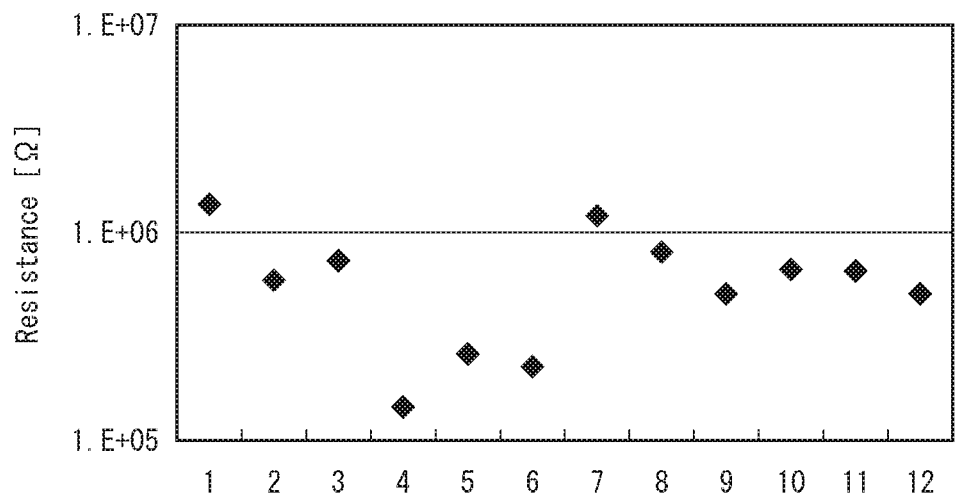
FIG. 8 shows the electrical resistance measured between each of the wirings and the cathode in the organic EL display panel.

Next, verification was performed on lowering of the electrical resistance between each wiring and part of a cathode facing the wiring. Specifically, an organic light-emitting device was created, which includes wirings that are each composed of a reflective electrode and a first transparent electrode, an intermediate layer that includes sodium fluoride and metal, an organic functional layer, and a second transparent electrode, which are layered. Then, the electrical resistance was measured between each of the wirings and part of the cathode facing the wiring. Twelve types of samples were created, each of which include the reflective electrode, the first transparent electrode, the intermediate layer, the organic functional layer, and the second transparent electrode that are layered. The reflective electrode has a thickness of 400 nm, the first transparent electrode has a thickness of 5 nm, and the organic functional layer has a thickness of 35 nm. FIG. 7 shows a table of composition of the intermediate layer and the organic functional layer in the samples. FIG. 8 shows the plot of the electrical resistance between each of the wirings and part of the cathode facing the wiring in the samples. In the figure, the horizontal axis represents the sample number, and the vertical axis represents the electrical resistance between each of the wirings and the part of the cathode facing the wiring (hereinafter, also referred to simply as electrical resistance).

Sample 1, which includes the intermediate layer made only of sodium fluoride, has an electrical resistance of $1.4E+06\Omega$. Compared with this, Samples 2-12, each of which include the intermediate layer including sodium fluoride and either aluminum or barium, each have a lower electrical resistance than Sample 1, which has the electrical resistance of $1.4E+06\Omega$. This demonstrates that inclusion of aluminum or barium in addition to sodium fluoride in the intermediate layer lowers the electrical resistance between each of the wirings and the part of the cathode facing the wiring. Inclusion of barium in the intermediate layer lowers the electrical resistance between each of the wirings and the part of the cathode facing the wiring because barium cleaves a bond between sodium and fluorine in sodium fluoride, which has a high electrical resistivity, and thus an amount of sodium fluoride included in the intermediate layer is reduced, as shown in FIGS. 6A and 6B. Inclusion of aluminum in the intermediate layer lowers the electrical resistance between each of the wirings and the part of the cathode facing the wiring for the similar reason. In the case where barium or aluminum is included in the intermediate layer, a bond between sodium and fluorine in sodium fluoride is cleaved by thermal energy for forming a film from barium or aluminum. Results of comparison between Samples 2-6 and Samples 7-12 demonstrate a tendency that inclusion of aluminum lowers the electrical resistance between each of the wirings and the part of the cathode facing the wiring more greatly than inclusion of barium does. This is because aluminum decomposes sodium fluoride more easily than barium does.

Returning to FIGS. 7 and 8, Samples 2 and 4 have different thicknesses of sodium fluoride, and specifically have 4.0 nm and 1.0 nm, respectively. Sample 2 has an electrical resistance of $5.8E+05\Omega$, and Sample 4 has an electrical resistance of $1.4E+05\Omega$. This demonstrates that the thinner sodium fluoride is, the lower the electrical resistance between each of the wirings and the part of the cathode facing the wiring is. Further, the same is demonstrated from results of comparison among Samples 3, 5, and 6, comparison between Samples 7 and 9, and comparison between Samples 8 and 10. The same applies to the thickness of metal. For example, Samples 7 and 8 have different thicknesses of barium, and specifically have 0.5 nm and 1.0 nm, respectively. Sample 7 has an electrical resistance of $1.2E+06\Omega$, and Sample 8 has an electrical resistance of $8.1E+05\Omega$. This demonstrates that the thicker barium is, the lower the electrical resistance between each of the wirings and the part of the cathode facing the wiring is. The same applies to the concentration of barium. For example, Samples 2 and 3 have different concentrations of barium, and specifically have 20 wt % and 5 wt %, respectively. Sample 2 has an electrical resistance of $5.8E+05\Omega$, and Sample 3 has an electrical resistance of $7.3E+05\Omega$. This demonstrates that the higher the concentration of barium is, the lower the electrical resistance between each of the wirings and the part of the cathode facing the wiring is. From the above, it is possible to greatly lower the electrical resistance between each of the wirings and the part of the cathode facing the wiring by adjusting the thickness of sodium fluoride, the thickness of metal, and the type of metal in the intermediate layer, and the doping concentration of metal in the electron transport layer.

(Electrical Resistance after Storage at High Temperature)

The temperature of organic EL display panels rises while being driven. Also, there is a demand for prevented luminance unevenness in the organic EL display panels even after storage for a long time. In view of these, electrical resistance between each of wirings and part of a cathode facing the wiring was measured immediately after an organic EL display panel was prepared and after the organic EL display panel was stored at a high temperature. Specifically, three types of samples were prepared, and the electrical resistance between each of the wirings and the part of the cathode facing the wiring was measured with respect to each of the samples. Further, the electrical resistance was again measured after the samples were stored at 80 degrees C. for 240 hours. Sample 1 is an element that includes a wiring that is composed of a reflective anode and a transparent electrode, an intermediate layer made only of a sodium fluoride layer having a thickness of 4.0 nm, an organic functional layer having a thickness of 35.0 nm and with which barium is doped at a concentration of 20 wt %, and a transparent electrode, which are layered. Sample 2 is an element that differs from Sample 1 in terms of including an intermediate layer including a sodium fluoride layer having a thickness of 4.0 nm and a barium layer having a thickness of 1.0 nm. Sample 3 is an element that differs from Sample 1 in terms of including an intermediate layer including a sodium fluoride layer having a thickness of 1.0 nm and a barium layer having a thickness of 0.5 nm.

Figure 9:
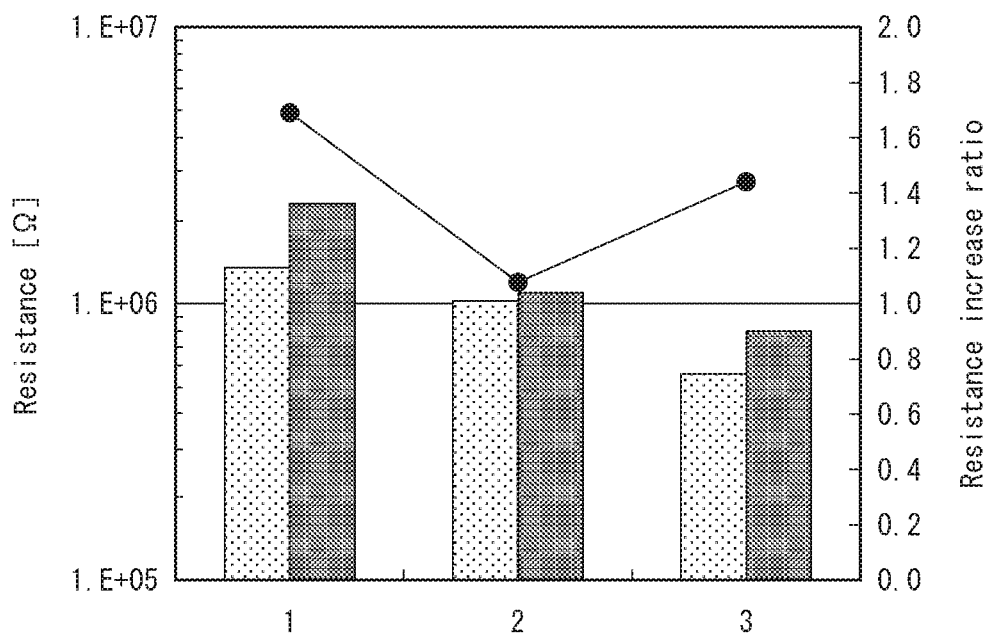
FIG. 9 shows the electrical resistance between each of the wirings and the cathode before and after storage at high temperature and a resistance increase ratio.

FIG. 9 is a graph showing variation in the electrical resistance between each of the wirings and the part of the cathode facing the wiring in accordance with variation in element composition. In the figure, the horizontal axis represents the sample number, and the respective vertical axes represent the electrical resistance between each of the wirings and the part of the cathode facing the wiring and the resistance increase ratio of the electrical resistance after storage at a high temperature. With respect to each of the samples, the left bar graph represents the electrical resistance immediately after preparation of the sample (hereinafter, referred to as initial electrical resistance) and the right bar graph represents the electrical resistance after storage at a high temperature. The circular plots represent the resistance increase ratio of the electrical resistance. Note that the resistance increase ratio indicates the ratio of the electrical resistance after storage at a high temperature to the initial electrical resistance.

Sample 1 had an initial electrical resistance of 1.4E+06Ω and an electrical resistance of 2.3E+06Ω after storage at a high temperature. This demonstrates that just provision of the intermediate layer made only of fluoride is insufficient for achieving resistance to high temperature in each of the wirings and the part of the cathode facing the wiring. Compared with this, Sample 2 had an initial electrical resistance of 1.0E+06Ω and an electrical resistance of 1.1E+06Ω after storage at a high temperature. Thus, the increase of the electrical resistance after storage at a high temperature was prevented. Sample 3 had an initial electrical resistance of 5.6E+05Ω and an electrical resistance of 8.0E+06Ω after storage at a high temperature. Resistance increase was observed also with respect to Sample 3 though Sample 3 had an improved resistance increase ratio compared with Sample 1. This is because Sample 3 had a low property of blocking components that cause degradation due to the thin intermediate layer. By including sodium fluoride and barium in the intermediate layer of the organic EL display panel in this way, it is possible to lower the electrical resistance between each of the wirings and the part of the cathode facing the wiring and prevenet the increase of the electrical resistance due to thermal stress. This prevents the luminance unevenness in the panel screen. This effect is prominently exhibited especially by the structure such as Sample 2.

(Measurement of Electron Current)

Next, analysis was performed on electrical resistance between each of anodes and a cathode in the case where an intermediate layer is disposed between each of the anodes and the cathode. Specifically, electron-only elements were created as samples for Example 2 and Comparative example 2, and the electron current was measured and analyzed. The sample for Example 2 is an electron-only element that includes a reflective anode, a first transparent electrode having a thickness of 16.0 nm, a light-emitting layer having a thickness of 110.0 nm, an intermediate layer including a sodium fluoride layer having a thickness of 4.0 nm and a barium layer having a thickness of 0.2 nm, an organic functional layer having a thickness of 35.0 nm, and a second transparent electrode, which are layered. The sample for Comparative example 2 differs from that for Example 2 in terms of including an intermediate layer including only a sodium fluoride layer having a thickness of 4.0 nm.

Figure 10:
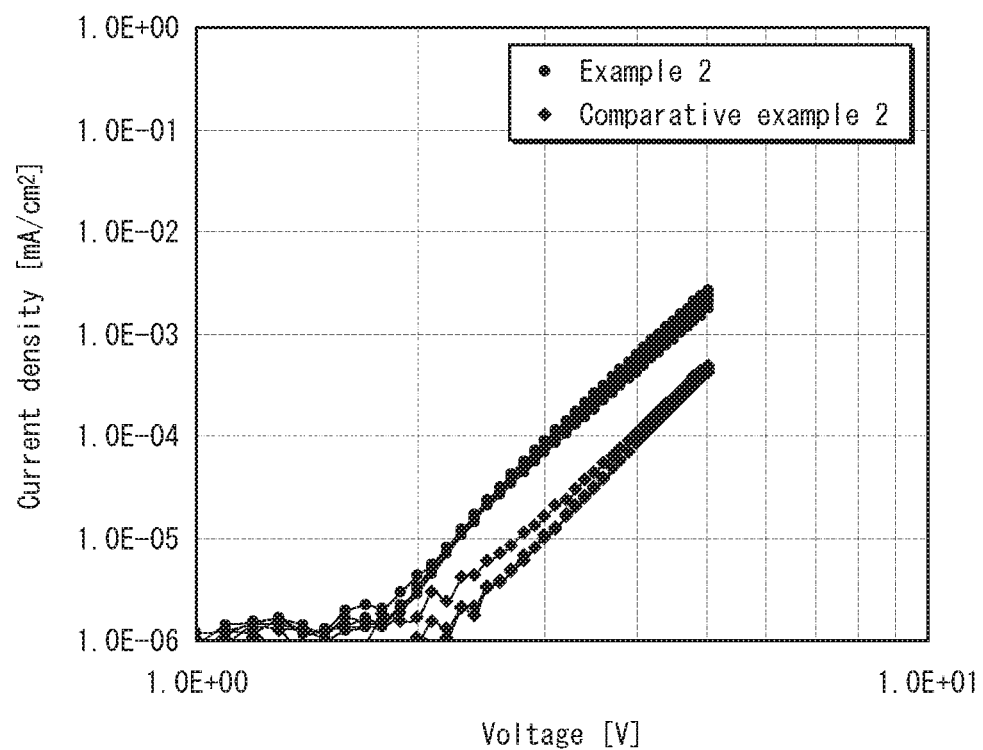
FIG. 10 shows a relation between applied voltage and current density in an electron-only element.

FIG. 10 is a graph showing the electron current. In the figure, the horizontal axis represents the voltage applied to the electron-only element, and the vertical axis represents the current density. Also, circular plots and rhombic plots represent measurement results of the samples for Example 2 and Comparative example 2, respectively.

The current density relative to the voltage is higher in Example 2 than in Comparative example 2, and the value of the voltage at which the current density starts rising is lower in Example 2 than in Comparative example 2. Here, the electron-only elements were used in the measurement, and accordingly the current density shown in the figure is the density of the electron current. This demonstrates that inclusion of sodium fluoride and barium in the intermediate layer in Example 2 improves an electron injection property from the organic functional layer to the light-emitting layer.

(Luminous Efficiency after Storage at High Temperature)

It is considered that the performance between each of anodes and a cathode degrades due to thermal stress, like each of wirings and part of the cathode corresponding to the wiring. In view of this, efficiency ratio was measured with respect to elements of samples, which differ from each other in structure, after storage at a high temperature. Specifically, with respect to three types of samples which were stored for 15 to 20 days at 80 degrees C., the efficiency ratio in the elements was measured every several days immediately after preparation of the samples. Here, the efficiency ratio indicates a ratio of luminance per unit inrush current after storage at a high temperature to luminance per unit inrush current immediately after preparation of the samples. The sample for Example 3 is an element that includes an IZO layer having a thickness of 50 nm, a hole injection layer having a thickness of 5 nm or 35 nm, a hole transport layer having a thickness of 10 nm, a light-emitting layer having a thickness of 50 nm, an intermediate layer including a sodium fluoride layer having a thickness of 4 nm and a barium layer having a thickness of 2 nm, an organic functional layer having a thickness of 35 nm and with which barium is doped at a concentration of 5 wt %, and an aluminum layer having a thickness of 120 nm, which are layered on a glass substrate. The sample for Comparative example 3(1) differs from Example 3 in terms of including an intermediate layer including only a sodium fluoride layer having a thickness of 4 nm. The sample for Comparative example 3(2) differs from Example 3 in terms of including no intermediate layer.

Figure 11:
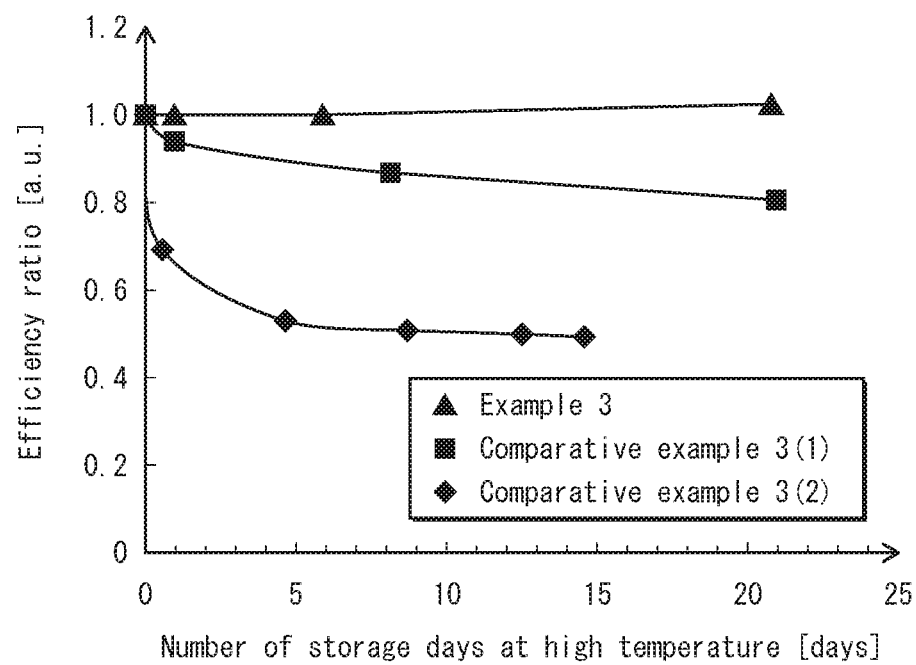
FIG. 11 shows an efficiency ratio before and after storage at a high temperature.

FIG. 11 is a graph showing the number of days for which the elements were stored at a high temperature and the efficiency ratio. In the figure, the horizontal axis represents the number of days for which the elements were stored at a high temperature, and the vertical axis represents the efficiency ratio. Also, triangle plots, square plots, and rhombic plots represent measurement results of the samples for Example 3, Comparative example 3(1), and Comparative example 3(2), respectively.

Comparison between Comparative example 3(1) and Comparative example 3(2) demonstrates that inclusion of the intermediate layer made only of sodium fluoride reduces the degradation of efficiency. Further, comparison between Example 3 and Comparative example 3(1) demonstrates that inclusion of the intermediate layer including sodium fluoride and barium reduces the degradation of efficiency more than inclusion of the intermediate layer made only of sodium fluoride, and specifically causes no substantial variation of the degradation of efficiency. With respect to Comparative example 3(2), it is considered that the luminance per unit inrush current after storage at a high temperature in the organic EL display panel varies due to oxygenation of metal included in the organic functional layer and the cathode caused by impurities such as moisture and oxygen.

From the above, the intermediate layer exhibits an effect of increasing the amount of electron current and improving the resistance to the thermal stress between each of the anodes and the cathode, as well as an effect of decreasing the electrical resistance and improving the resistance to the thermal stress between each of the wirings and part of the cathode corresponding to the wiring. This greatly prevents the luminance unevenness in the organic EL display panel.

(Thickness of Organic Functional Layer)

The organic functional layer should preferably have a thickness of 25 nm to 45 nm. This thickness range ensures a light-extraction efficiency of 80% relative to the peak light-extraction efficiency. Also, the organic functional layer should further preferably have a thickness of 30 nm to 40 nm. This thickness range ensures a light-extraction efficiency of 90% relative to the peak light-extraction efficiency.

<Modifications>

Although the explanation has been given on the present disclosure based on the embodiment, the present disclosure is not limited to the embodiment. The following modifications for example may be made.

1. Wirings

In the above embodiment, the wirings are each linear. However, the shape of the wirings is not limited to a linear shape, and may have other shape. For example, the wirings may be connected to each other to have a net-like shape.

2 Upper Substrate

Although not shown in the above embodiment, an upper substrate may be adhered onto the sealing layer. This further prevents intrusion of moisture and oxygen into the organic functional layer and the cathode from the opposite side of the substrate.

3 Electron Injection Layer

The organic light-emitting device relating to the embodiment of the present disclosure may include an electron injection layer as the organic functional layer. The electron injection layer has a function of promoting injection of electrons from the cathode to the light emitting layers. The electron injection layer is made for example of a metal having a low work function such as lithium, barium, calcium, potassium, cesium, sodium, and rubidium, a metal salt having a low work function such as lithium fluoride, a metal oxide having a low work function such as barium oxide (BaO), or the like.

4. Hole Injection Layers and Hole Transport Layers

The organic light-emitting device relating to the embodiment of the present disclosure includes the hole injection layers and the hole transport layers, which are each disposed between a corresponding one of the anodes and a corresponding one of the light-emitting layers. Alternatively, the organic light-emitting device may include only the hole injection layers or the hole transport layers. Further alternatively, the organic light-emitting device may not need to include the hole injection layers and the hole transport layers.

5. Structure

In the above embodiment, the organic light-emitting device is of the top emission type according to which light is extracted from the opposite side of the substrate. Alternatively, a bottom emission type may be adoptable. In the case where the organic light-emitting device is of the bottom emission type, the anodes should have a single-layer structure including a transparent conductive material.

6. Others

In the above embodiment, the organic EL display panel is exemplified as the organic light-emitting device of the present disclosure. Alternatively, the organic light-emitting device of the present disclosure may be applicable to lighting devices and the like.

INDUSTRIAL APPLICABILITY

The present disclosure is utilizable for example as organic EL display panels, lighting devices, and the like. The present disclosure is preferably utilizable for example as organic light-emitting devices for use as displays and the like in various types of display devices for households, public facilities, and business, television devices, portable electronic devices, and so on.

REFERENCE SIGNS LIST 100 organic EL display panel
11 substrate
12 interlayer insulating layer
13 anode
14 wiring
15 hole injection layer
16 barrier rib layer
17 hole transport layer
18 light-emitting layer
19 intermediate layer
20 organic functional layer
21 cathode
22 sealing layer

The invention claimed is:
1. An organic light-emitting device comprising:
an anode;
a wiring that is disposed side-by-side with and spaced from the anode;
a light-emitting layer that is disposed above the anode, and includes an organic light-emitting material;
an intermediate layer that is disposed above the light-emitting layer and the wiring;
an organic functional layer that is disposed above the intermediate layer, and has an electron injection property or an electron transport property;

a cathode that is disposed above the organic functional layer, wherein
the intermediate layer includes:
a fluoride of a first metal, the first metal being an alkali metal or an alkaline-earth metal; and
a second metal that has a property of cleaving a bond between the first metal and fluorine in the fluoride.

2. The organic light-emitting device of claim 1, wherein the fluoride is sodium fluoride (NaF) or lithium fluoride (LiF).

3. The organic light-emitting device of claim 1, wherein the second metal is barium (Ba).

4. The organic light-emitting device of claim 1, wherein the second metal has an electron injection property or an electron transport property, and
the organic functional layer includes the same metal as the second metal.

5. The organic light-emitting device of claim 1, wherein the anode and the wiring are made of the same material.

6. The organic light-emitting device of claim 1, wherein the anode is made of indium tin oxide (ITO) or indium zinc oxide (IZO).

7. The organic light-emitting device of claim 1, wherein the cathode is made of a transparent conductive material.

8. The organic light-emitting device of claim 7, wherein the transparent conductive material is ITO.

9. The organic light-emitting device of claim 1, further comprising
a hole injection layer that is disposed on each of the anode and the wiring, and is made of tungsten oxide ($WO_x$) or molybdenum oxide ($MoO_x$).

10. The organic light-emitting device of claim 1, wherein the organic functional layer has a thickness of 25 nm to 45 nm inclusive.

11. The organic light-emitting device of claim 1, wherein the organic functional layer has a thickness of 30 nm to 40 nm inclusive.

12. A manufacturing method of an organic light-emitting device, the manufacturing method comprising:
forming an anode and a wiring so as to be disposed side-by-side with and spaced from each other;
forming, above the anode, a light-emitting layer that includes an organic light-emitting material;
forming, above the light-emitting layer and the wiring, an intermediate layer;
forming, above the intermediate layer, an organic functional layer that has an electron injection property or an electron transport property;
forming, above the organic functional layer, a cathode, wherein
the intermediate layer includes:
a fluoride of a first metal, the first metal being an alkali metal or an alkaline-earth metal; and
a second metal that has a property of cleaving a bond between the first metal and fluorine in the fluoride.

13. The manufacturing method of claim 12, wherein the forming the intermediate layer includes
depositing the fluoride above the light-emitting layer and the wiring, and depositing the second metal above the fluoride.

* * * * *